(12) United States Patent
Mayer

(10) Patent No.: US 6,255,831 B1
(45) Date of Patent: Jul. 3, 2001

(54) MILLIMETER WAVE MEASUREMENT PROCESS

(75) Inventor: Bernd Mayer, Munich (DE)

(73) Assignee: Deutsche Forschungsanstalt Fur Luft-Und Raumfahrt E.V., Köln (DE)

( * ) Notice: Subject to any disclaimer, the term of this patent is extended or adjusted under 35 U.S.C. 154(b) by 703 days.

(21) Appl. No.: 08/580,823

(22) Filed: Dec. 29, 1995

(30) Foreign Application Priority Data

Jan. 4, 1995 (DE) .............................................. 195 00 077

(51) Int. Cl.$^7$ ........................... G01R 27/04; G01N 27/00
(52) U.S. Cl. ........................ 324/636; 324/636; 324/632; 324/71.6
(58) Field of Search ................................. 324/71.6, 632, 324/636, 633, 600

(56) References Cited

U.S. PATENT DOCUMENTS

| 4,885,527 | * | 12/1989 | Lacombe | 324/636 |
| 5,440,238 | * | 8/1995 | Martens | 324/632 |
| 5,506,497 | * | 4/1996 | Klein | 324/636 |
| 5,563,505 | * | 10/1996 | Dorothy | 324/632 |
| 5,594,351 | * | 1/1997 | Hearn | 324/632 |

FOREIGN PATENT DOCUMENTS

| 42 04 369 | 9/1993 | (DE) . |
| 94/04935 | 3/1994 | (WO) . |

OTHER PUBLICATIONS

Unger, H.–G., "Elektromagnetische theorie fur die Hochfrequenztechnik (Electromagnetic theory for High–Frequency Technology)", Huthig, pp. 229–274 (1981).

Kuhlemann, Thorsten et al., "Computer–controlled system for surface resistance measurements of $HT_c$ Superconducting Films", IEEE Transaction on Instrumentation and Measurement, vol. 40, No. 3, pp. 539–543 (Jun. 1991).

* cited by examiner

*Primary Examiner*—Vinh P. Nguyen
*Assistant Examiner*—Anjan K Deb
(74) *Attorney, Agent, or Firm*—Browdy & Neimark

(57) ABSTRACT

With the help of the millimeter wave measurement system, the surface impedance is determined by means of one or a plurality of resonators with very high three dimensional resolution when there are relatively large resonator openings in the millimeter wave range. By means of this, structures with measurements of 1/10 the resonator openings can be solved with no trouble (FIG. 1).

2 Claims, 4 Drawing Sheets

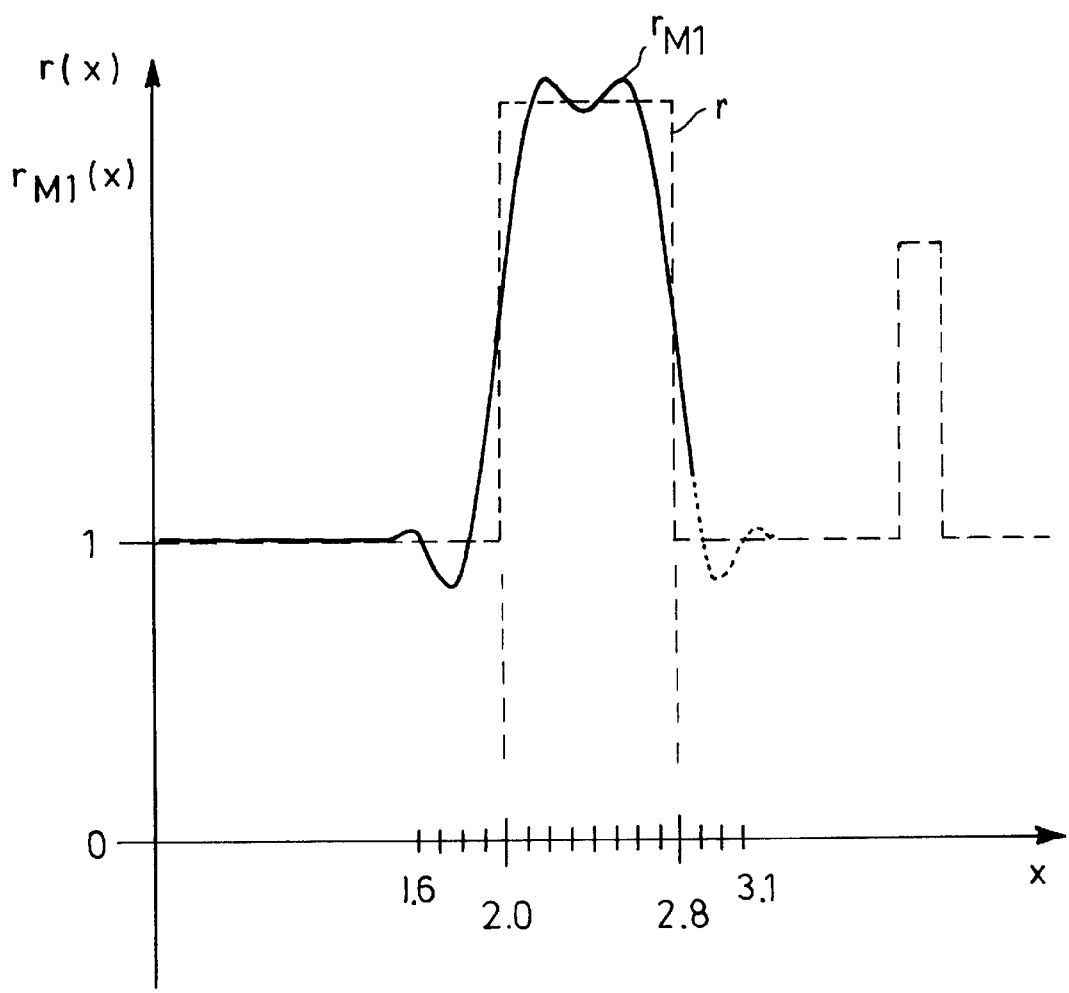

MILLIMETER WAVE MEASUREMENT PROCESS

The invention relates to a millimeter wave measurement process.

From H.-G. Unger, Elektromagnetische Theorie für die Hochfrequenztechnik [Electromagnetic Theory for High-Frequency Technology], Hüthig 1981, it is known that with quality measurements (Vol.1, Eq. 3.75 and Eq. 3.77) and resonant frequency measurements (Vol. 2, Eq.9.17) in cavity resonators, the surface impedance $Z_{ob}=R_{ob}+jX_{ob}$ can be determined. Furthermore, it is also known from H.-G. Unger that in a cavity resonator, an infinite number of vibrational modes is possible, regardless of the particular shape (Vol. 2, p. 269).

As T. Kuhlemann and J. H. Hinken explain in "Computer-Controlled System for Surface Resistance Measurements of HTc Superconducting Films", IEEE Transactions on. Instrumentation and Measurement, Vol. 40, No. 3, June 1991, pp. 539–543, this is also possible with high temperature superconducting films.

Furthermore, German patent disclosure DE 42 04 369 C2 and international patent disclosure WO 94/04935 A1 disclose processes for quality determination of high temperature superconducting films.

In the known measurement processes, though, only the average values $\overline{R_{ob}}$ and $\overline{X_{ob}}$ are recorded, which are given by:

$$\overline{R}_{Ob} = \int R_{Ob}|H_t|^2 da \bigg/ \int |H_t|^2 da \text{ and}$$

$$\overline{X}_{Ob} = \int X_{Ob}|H_t|^2 da \bigg/ \int |H_t|^2 da$$

These measurement data can only be used if $\overline{R}_{ob} \approx R_{ob}(\vec{r})$ and $\overline{X}_{ob} \approx X_{ob}(\vec{r})$ at each point $\vec{r}$.

If the surface impedance, though, is location dependent, then if need be, the average value functions $\overline{R}_{ob}(\vec{r})$ and $\overline{X}_{ob}(\vec{r})$ can be determined by measurements at various places $\vec{r}$ on the surface. In actual practice, this is very disadvantageous since surface defects which are significant, but small in area are not detected. In very expensive surfaces, such as high temperature superconducting films, this fact is of particular significance. Since films of this kind are comprised of a plurality of elements, such as yttrium, barium, copper, and oxygen, regions with increased losses can appear within large-area coatings. If only the average value functions $\overline{R}_{ob}(\vec{r})$ and $\overline{X}_{ob}(\vec{r})$ are used for quality assurance, either regions of this kind are not detected or large areas of these places have to be discarded. If such defective half-finished products are released for the manufacture of components, for example microwave filters, only later do these undetected regions cause component malfunctions, which brings about considerable additional costs.

If on the other hand, places with unacceptable quality are detected, large-area regions in their vicinity must be discarded. As a result, valuable usable material is wasted; there is an increased environmental impact and a substantial increase in cost.

The object of the invention, therefore, is to create a millimeter wave measurement system, which makes it possible to determine the surface impedance exactly in three-dimensional terms $Z_{ob}(\vec{r})=R_{ob}(\vec{r})+j X_{ob}(\vec{r})$.

According to the invention, this object is attained by a millimeter wave measurement system as defined by the body of claim 1.

The invention will be explained in detail below in terms of preferred embodiments with reference to the accompanying drawings.

FIG. 4 shows a function r(x) together with $r_{M1}(x)$.

Figure 1:
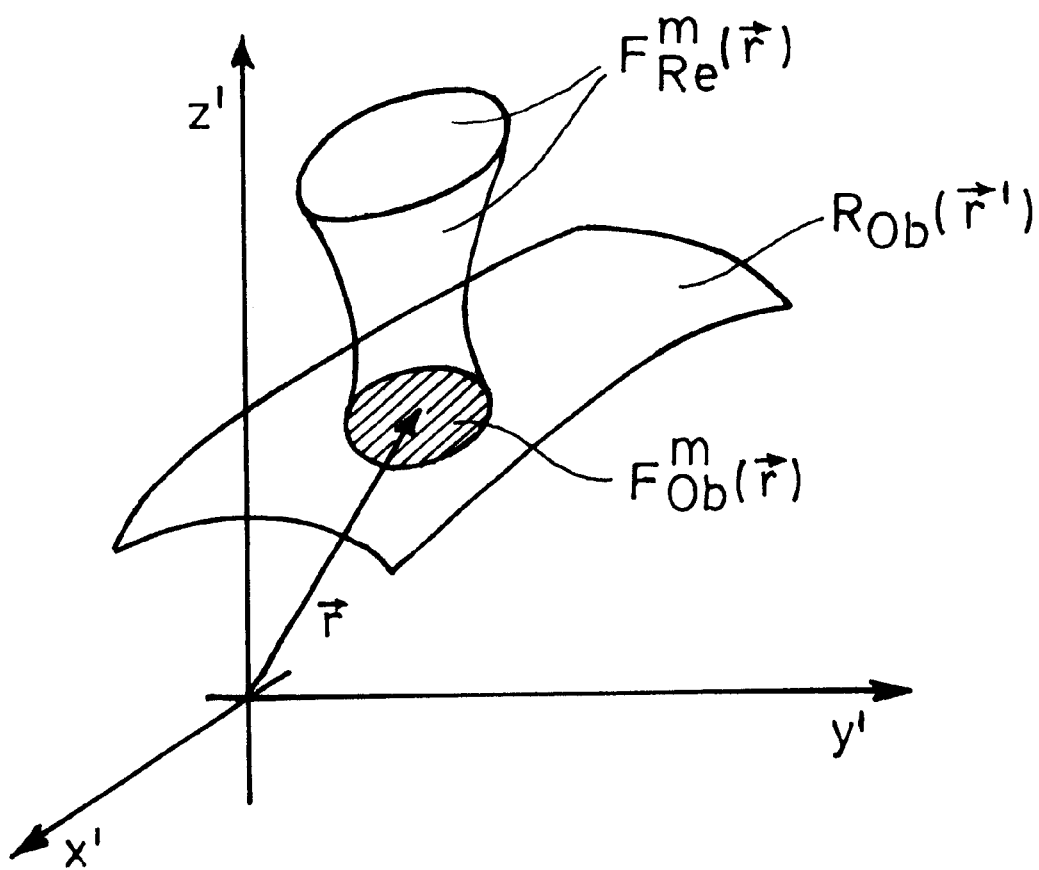
FIG. 1 shows a section of a surface to be measured in an x', y', z' coordinate system.

First, unloaded quality factors $Q_o^{n_{lm}}(\vec{r})$ are recorded by measurement technology at each point $\vec{r}$ of the surface to be measured (see FIG. 1). In this case, a resonator is indicated by the reference letter m and a vibrational mode is indicated by $n_m$. One of the known methods can be used, for instance the 3-dB method (see T. Kuhlemann and J. H. Hinken in the above-mentioned place). Integral equations for $R_{ob}(\vec{r})$ are then arrived at with these measurement values. If the surface reactance is to be determined as well, then the integral equations for $X_{ob}(\vec{r})$ are additionally arrived at. And in general, at least two resonators have to be used in order to unambiguously determine all details in the $R_{ob}(\vec{r})$ or the $X_{ob}(\vec{r})$ functions; this is explained later from an exemplary embodiment.

The surface resistance distribution or surface reactance distribution sought after is obtained by solving the integral equations. Finding solutions for integral equations, though, is a very large problem. An overview can be found for example in Stefan Fenyo and Hans W. Stelle, *Theory and Practice of Linear Integral Equations*, [Theorie und Praxis der linearen Integralgleichungen] Birkhauser Verlag 1984, Vol. 1–4.

In the present instance, for the particular case in which the field distribution and therefore also the tangential magnetic field intensity of the resonators are independent of the area observed, integral equations are obtained from the convolution type. This type of equation can be advantageously solved by a Fourier or Laplace transform, but only if the necessary inverse transforms exist (see A. D. Myschkis, *Angewandte Mathematik für Physiker und Ingenieure*, [Applied Mathematics for Physicists and Engineers] Verlag Harri Deutsch, 1981, p. 460). However, this is normally not the case. This difficulty is rectified according to the invention by using two or more different resonators.

Figure 2:
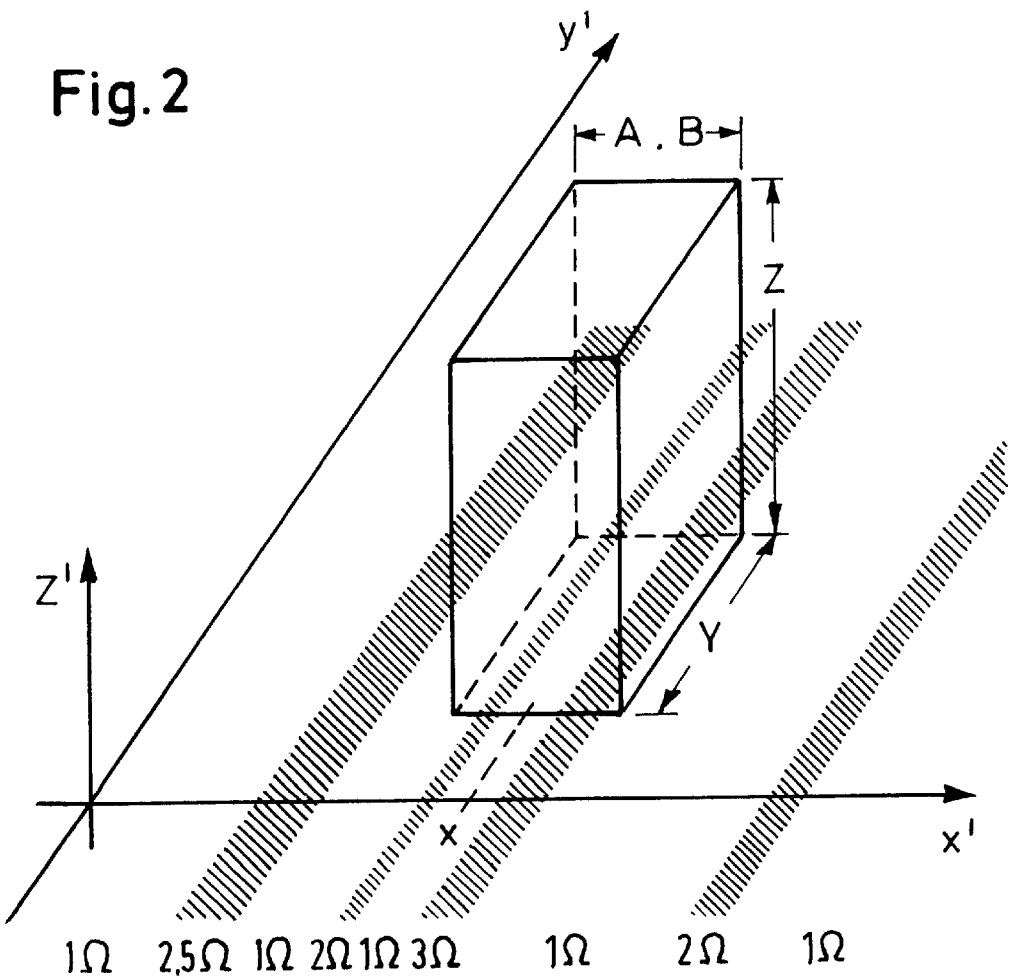
FIG. 2 shows a schematic surface resistance distribution in perspective in an x, y, z coordinate system.

The invention will be explained below in terms of an exemplary embodiment. The surface resistance distribution sketched in the x'- y' plane in FIG. 2 is to be measured with three dimensional resolution. To describe the principle, it is sufficient to assume a surface resistance profile $R_{ob}(x')$ which depends only on the x' coordinate, since the mathematical expressions are then essentially simpler and therefore more clear. The measurement is carried out with two single-mode H011 rectangular resonators. In an x, y, z Cartesian coordinate system, the first resonator has the limits $-A/2 \leq x \leq A/2$, $0 \leq y \leq Y$, and $0 \leq z \leq Z$ and the second resonator has the limits $-B/2 \leq x \leq B/2$, $0 \leq y \leq Y$, and $0 \leq z \leq Z$. For measurement, both resonators are moved in the x' direction; the measurement surfaces $-A/2 \leq x \leq A/2$, $0 \leq y \leq Y$, and $z=0$ or $-B/2 \leq x \leq B/2$, $0 \leq y \leq Y$, and $z=0$ are part of the x'–y' plane and the resonator planes are kept parallel to the y' coordinate with $x=\pm A/2$ or $x=\pm B/2$.

Figure 3A:
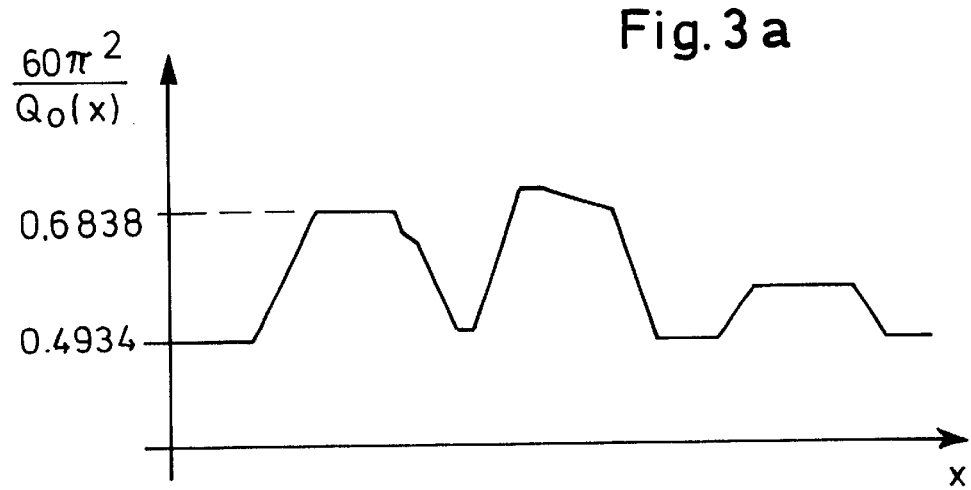
FIG. 3a shows a curved representation of the reciprocal value of a measurement quantity $Q_o$ multiplied by 60 $\Pi^2$ as a function of the position of a measurement resonator.
Figure 3B:
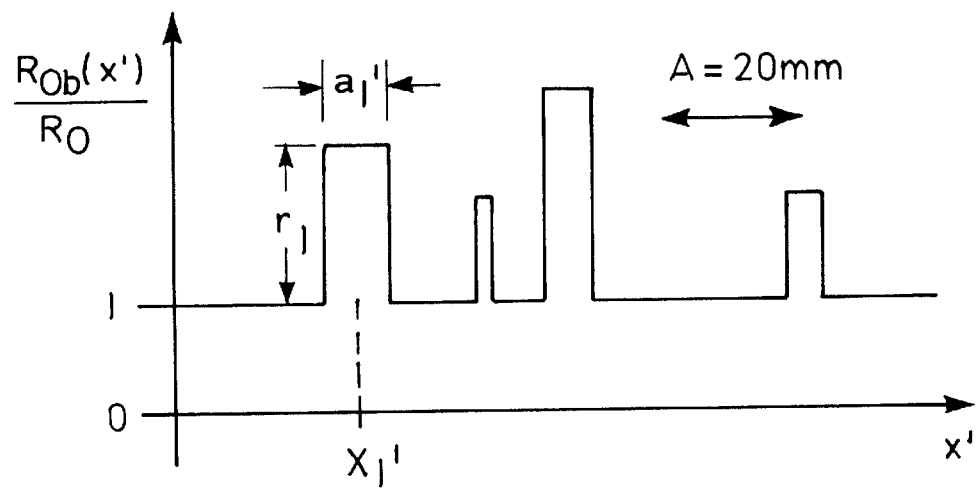
FIG. 3b shows a curved representation of a normalized surface resistance course $(R_{ob}(x'))$ as a function of the position x' on a surface to be measured.

FIG. 3b shows the course of $R_{ob}$ (x') with x' as a dependent coordinate. By using the rect function, which is defined by $$\text{rect}(x') = \begin{cases} 1 & |x'| < 1 \\ 0 & \text{else} \end{cases}$$

$R_{ob}$ (x') can be represented mathematically as $$R'_{0b}(x') = R_0 + \sum_{n=1}^{4} R_n \text{rect}\left(\frac{x' - x'_n}{a'_n}\right)$$

or represented normalized at $R_0$ as $$\frac{R_{0b}(x')}{R_0} = 1 + \sum_{n=1}^{4} r_n \text{rect}\left(\frac{x' - x'_n}{a'_n}\right) = ! r(x').$$

R. F. Harrington, *Time—Harmonic Electromagnetic Fields*, McGraw Hill Book Company, 1961, p. 75, makes known the field components of H011 rectangular resonators:

$$E_x = E_0 \sin\frac{\pi y'}{Y} \sin\frac{\pi z'}{Z}$$

$$H_y = \frac{jYE_0}{\sqrt{\mu/\epsilon}\sqrt{Y^2 + Z^2}} \sin\frac{\pi y'}{Y} \sin\frac{\pi z'}{Z}$$

$$H_z = \frac{-jZE_0}{\sqrt{\mu/\epsilon}\sqrt{Y^2 + Z^2}} \cos\frac{\pi y'}{Y} \sin\frac{\pi z'}{Z}$$

The resonance angular frequency yields $$\omega_r = \frac{\pi\sqrt{Y^2 + Z^2}}{\sqrt{\mu/\epsilon}\, YZ}.$$

Both resonators therefore have the same resonance angular frequency. The integral equation for $R_{ob}$ (x') is derived below.

M=2 resonators are used, each with one vibrational mode, i.e. m=1, 2, $N_1 = 1$ and $N_2 = 1$. Consequently exactly two integral equations are produced, one of which is derived below. The second is produced by substituting A with B. Both resonators should be manufactured of the same material. Then $R_{Re}{}^1 = R_{Re}{}^2$,. (The indices m and n are not necessary in the present case and are therefore left out.) In addition, no additional losses P should occur.

In the Cartesian x'-y' plane, the area element proves to be $da' = dx'\, dy'$ and the integration area $F_{ob}(x)$ at the place x yields $$F_{0b}(x) = \begin{cases} 0 \leq y' \leq Y \\ x - A/2 \leq x' \leq x + A/2 \end{cases}$$

The absolute value square of the tangential magnetic field intensity in the measurement surface is $$|H'_t(x' - x, y')|^2 =$$

$$|H_y(x'-x, y', z=0)|^2 = \left[\frac{YE_0}{\sqrt{\mu/\epsilon}\sqrt{Y^2+Z^2}} \sin\frac{\pi y'}{Y}\right]^2 = ! H_0^2 \sin^2\frac{\pi y'}{Y}.$$

The left side of the integral equation yields $$\int_{x-A/2}^{x+A/2} R_{0b}(x') \int_0^Y H_0^2 Y^2 \sin^2\frac{\pi y'}{Y} dx'\, dy' = \frac{Y^3}{2} H_0^2 \int_{x-A/2}^{x+A/2} R_{0b}(x') dx'$$

The right side of the integral equation, where $$W = \frac{\epsilon}{4}|E_0|^2 AYZ, \quad \text{becomes} \quad \frac{\omega W}{Q_0(x)} - R_{Re}\int_{F_{Re}} |H_t|^2 da,$$

wherein it has been assumed that the resonator is manufactured out of homogeneous material with the surface resistance $R_{Re}$. The integration via $F_{Re}$ yields:

$$R_{Re}\int_{F_{Re}} |H_t|^2 da = \frac{H_0^2}{2}[YZ(Y^2 + Z^2) + 2A(Z^3 + Y^3)]$$

Hence the integral equation for the first resonator is:

$$\frac{Y^3 H_0^2}{2}\int_{x-A/2}^{x+A/2} R_{0b}(x') dx' =$$

$$\frac{\omega\epsilon|E_0|^2 AYZ}{4Q_0(x)} - \frac{H_0^2}{2}[YZ(Y^2+Z^2) + 2A(Z^3+Y^3)]$$

and the integral equation for the second resonator is:

$$\frac{Y^3 H_0^2}{2}\int_{x-B/2}^{x+B/2} R_{0b}(x') dx' =$$

$$\frac{\omega\epsilon|E_0|^2 BYZ}{4Q_0(x)} - \frac{H_0^2}{2}[YZ(Y^2+Z^2) + 2B(Z^3+Y^3)]$$

With the resonator measurements A=20 mm, B=20.75 mm, Y=32 mm, and Z=40 mm, resonance frequencies of 6 GHz are produced. For the values $a_1'=8$ mm, $a_2'=2$ mm, $a_3'=6$ mm, and $a_4'=4$ mm, as well as $x_1'=24$ mm, $x_2'=40$ mm, $x_3'=51$ mm, and $x_4'=82$ mm and $R_{Re}=0.01\ \Omega$ (a realistic value for material which conducts well), $$\frac{60\pi^2}{Q_0(x)} = \frac{0.0238}{\text{mm}\Omega}\int_{x-A/2}^{x+A/2} R_{0b}(x') dx' + 1.74\frac{R_{Re}}{\Omega}.$$

With the surface resistance course $R_{ob}$ (x') according to FIG. 3b, the curve indicated in FIG. 3a is then determined with measurement technology. For the sake of a simpler representation, the measurement quantity $Q_o$ (x) is not plotted, but the reciprocal value is plotted, multiplied by $60\Pi^2$.

Now the surface resistance course which is sought and is described in FIG. 3b below, is determined from the course described in FIG. 3a, which is determined in a measurement technical manner.

In the present case and in most other cases occurring in actual use, the integral equations—with a few exceptions—can be solved using a Fourier transform.

In order to use the Fourier transform, the integral equation is rewritten as follows:

$$\int_{-\infty}^{\infty} h_A(x'-x)r(x')dx' = \left[\frac{60\pi^2}{Q_0(x)} - 1.74\frac{R_{Re}}{\Omega}\right]\frac{mm}{0.0238} = !\, y_A(x)$$

wherein $$h_A(x'-x) = \text{rect}\left(\frac{x'-x}{A}\right) \quad \text{and} \quad h_B(x'-x) = \text{rect}\left(\frac{x'-x}{B}\right)$$

is true for the first or second resonator. With these abbreviations, both integral equations yield $$\int_{-\infty}^{\infty} h_A(x'-x)r(x')dx' = !\, y_A(x) \quad \text{and}$$

$$\int_{-\infty}^{\infty} h_B(x'-x)r(x')dx' = !\, y_B(x)$$

or $h_A(x)*r(x)=Y_A(x)$ and $h_a(x)*r(x)=Y_a(x)$ if, as is customary, the convolution operation is indicated with $*$. The use of the Fourier transform yields
$H_A(ju)\, R(ju)=Y_A(ju)$ or $H_B(ju)\, R(ju)=Y_B(ju)$ with $H_A(ju)=f\{h_A(x)\}$, $H_B(ju)=f\{h_B(x)\}$, $R(ju)=f\{r(x)\}$, $Y_A(ju)=f\{Y_A(x)\}$ and $Y_B(ju)=f\{Y_B(x)\}$.

The first equation can be solved for R(ju) by division except for the zero points of $H_A(ju)$. The same is true for the second equation. Fourier transform theory yields $$H_A(ju) = \frac{2\sin Au}{u} \quad \text{and} \quad H_B(ju) = \frac{2\sin Bu}{u}.$$

The zero positions are therefore at $$\frac{n\pi}{A} \quad \text{or} \quad \frac{m\pi}{B}$$

where
m, n=1, 2, 3 ..., i.e. R(ju) yields $$R(ju) = \frac{Y_A(ju)}{H_A(ju)} \quad \text{or} \quad R(ju) = \frac{Y_B(ju)}{H_B(ju)}$$

$$u \neq \frac{n\pi}{A}$$

where $$u \neq \frac{m\pi}{B}.$$

With these two relations, the Fourier transformed R(ju) of the function r(x) sought can be determined for the u values for which $$\frac{n\pi}{A} \neq \frac{m\pi}{B}$$

is true.

The choice of an irrational ratio A/B makes it possible to extend the u range to infinity.

In actual practice, though, a finite range is always adequate. In the present case (A=20.00 mm, B=20.75 mm), the first common zero position is situated at u=83 B=80A. If the inverse function of R(ju) is formed in such a way that for the range $0 \leq u \leq 80A=!U$, the function values are used, and if where $u \leq U$ the function values are set equal to zero, or in other words if the inverse function is therefore formed from $$R_M(ju) = \text{rect}\left(\frac{u}{U}\right)R(ju),$$

then $r_M(x)=f^{-1}\{R_M(ju)\}$ is obtained as a result. An error is caused by this setting the function values to zero where $u<U$. However, as already mentioned, the upper limit U can always be chosen so that the error makes no difference for actual use. The error is calculated below for the present example.

First, from $$r(x') = 1 + \sum_{n=1}^{4} r_n \text{rect}\left(\frac{x'-x'_n}{a'_n}\right),$$

the Fourier transform $$R(ju) = 2\pi\delta(u) = 2\sum_{n=1}^{4} r_n a_n \text{si}(ua_n)e^{-jux'_n}$$

is formed, using the abbreviation $\text{si}(x)=\sin(x)/x$. Multiplication by rect (u/U) yields $$R_M(ju) = 2\pi\delta(u) + 2\text{rect}\left(\frac{u}{U}\right)\sum_{n=1}^{4} r_n a_n \text{si}(ua_n)e^{-jux'_n}.$$

The Fourier reverse transform yields:

$$r_M(x) = 1 + r(x)*\text{si}(Ux)\frac{U}{\pi}$$

$$= 1 + \int_{-\infty}^{\infty} \sum_{n=1}^{4} r_n \text{rect}\left(\frac{x'-x'_n}{a'_n}\right)\frac{\sin U(x'-x)}{U(x'-x)}\frac{U}{\pi}dx'$$

$$= 1 + \sum_{n=1}^{4} r_n \int_{x'_n-a'_n/2}^{x'_n+a'_n/2} \frac{\sin U(x'-x)}{U(x'-x)}\frac{U}{\pi}dx'$$

$$= 1 + \frac{1}{\pi}\sum_{n=1}^{4} r_n[\text{Si}(x'_n + a'_n/2 - x)U - \text{Si}(x'_n - a'_n/2 - x)U]$$

The integral sine function Si(x) that occurs is tabulated by Abramowitz and Stegun in the *Handbook of Mathematical Functions,* Dover Publications, New York, 1979. The measurement function $r_M(x)$ can be. expressed in this way and the error $|r_M(x)-r(x)|$ can be determined. If it should turn out that the error is too great for the practical demands, the u range must be increased. The function $r_M(x)$ is evaluated below for x <3.2 mm, and the error is indicated. For this range, it is sufficient to evaluate the function $$r_{M1}(x)=1+[Si(x_1'+a_1'/2-x)U-Si(x_1'-a_1'/2-x)U],$$

since the higher order terms make now significant contribution for this range. The following table shows the result.

| x | r(x) | $r_{M1}(x)$ | $\frac{|r_{M1}(x) - r(x)|}{r(x)}(\%)$ |
|---|---|---|---|
| 1.6 | 1 | 1.03 | 3 |
| 1.7 | 1 | 0.88 | 12 |
| 1.8 | 1 | 0.86 | 14 |
| 1.9 | 1 | 1.19 | 19 |
| 2 | 1.75 | 1.78 | 1.7 |
| 2.1 | 2.5 | 2.33 | 6.8 |
| 2.2 | 2.5 | 2.57 | 2.8 |
| 2.3 | 2.5 | 2.52 | 0.8 |
| 2.4 | 2.5 | 2.47 | 1.2 |
| 2.5 | 2.5 | 2.52 | 0.8 |
| 2.6 | 2.5 | 2.57 | 2.8 |
| 2.7 | 2.5 | 2.33 | 6.8 |
| 2.8 | 1.75 | 1.78 | 1.7 |
| 2.9 | 1 | 1.19 | 19 |
| 3 | 1 | 0.86 | 14 |
| 3.1 | 1 | 0.88 | 12 |

FIG. 4 shows the function r(x) together with $r_{M1}(x)$. It can be seen that the entire surface resistance course can already be very precisely measured with the two resonators used, although the details are very much smaller than the resonator measurement surfaces. Greater errors occur only at the sharp changes of the measurement function. In actual practice, though, discontinuous functions of this kind hardly ever occur, and therefore the dimensions indicated fulfill the given requirements.

What is claimed is:

1. A process for detecting small irregularities on a conducting surface, comprising:

providing a first electrical cavity resonator having a first open end and at least one additional electrical cavity resonator having a second open end, the first open end and the second open end having different dimensions;

placing the first open end and the second open end adjacent the conducting surface;

exciting the resonators in the microwave region;

moving the resonators over the surface;

finding integrated surface impedance measurements over the first open end and the second open end by variations in Q-factors of the resonators in moving over the surface;

Fourier-transforming the impedance measurements; and determining locations of the small irregularities by correlating respective Fourier transforms;

whereby the locations are determined when the irregularities are smaller than any resonator open end.

2. A process for detecting small irregularities on a conducting surface, comprising:

providing an electrical cavity resonator having a first open end;

placing the first open end adjacent the conducting surface;

exciting the resonator in the microwave region in a first mode;

moving the resonator over the surface in a first pass;

exciting the resonator in the microwave region in a second mode;

moving the resonator over the surface in a second pass;

finding integrated surface impedance measurements by variations in Q-factors of the resonator in moving over the surface in the first pass and the second pass;

Fourier-transforming the impedance measurements; and determining locations of the small irregularities by correlating respective Fourier transforms;

whereby the locations are determined when the irregularities are smaller than any resonator open end.

* * * * *